US008739401B2

(12) United States Patent
Shimazaki et al.

(10) Patent No.: US 8,739,401 B2
(45) Date of Patent: Jun. 3, 2014

(54) CIRCUIT MEMBER, MANUFACTURING METHOD FOR CIRCUIT MEMBERS, SEMICONDUCTOR DEVICE, AND SURFACE LAMINATION STRUCTURE FOR CIRCUIT MEMBER

(75) Inventors: Yo Shimazaki, Shinjuku-ku (JP);
Hiroyuki Saito, Shinjuku-ku (JP);
Masachika Masuda, Shinjuku-ku (JP);
Kenji Matsumura, Shinjuku-ku (JP);
Masaru Fukuchi, Shinjuku-ku (JP);
Takao Ikezawa, Shinjuku-ku (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 9 days.

(21) Appl. No.: 12/878,137

(22) Filed: Sep. 9, 2010

(65) Prior Publication Data
US 2010/0325885 A1    Dec. 30, 2010

Related U.S. Application Data

(62) Division of application No. 11/912,163, filed as application No. PCT/JP2006/308721 on Apr. 26, 2006.

(30) Foreign Application Priority Data

Apr. 26, 2005   (JP) .................................. 2005-128259

(51) Int. Cl.
*H05K 3/10*    (2006.01)
(52) U.S. Cl.
USPC ............................................ 29/846; 438/123

(58) Field of Classification Search
USPC .......... 257/666, 739, 773, 692; 438/123, 665, 438/964
See application file for complete search history.

(56) References Cited

U.S. PATENT DOCUMENTS

| 3,981,691 A | * | 9/1976  | Cuneo ........................... 428/626 |
| 5,114,557 A |   | 5/1992  | Jahani |
| 6,025,640 A | * | 2/2000  | Yagi et al. ..................... 257/666 |
| 6,143,981 A |   | 11/2000 | Glenn |

(Continued)

FOREIGN PATENT DOCUMENTS

| EP | 0 890 660 A1  | 1/1999 |
| JP | 63-033853     | 2/1988 |
| JP | 08-046116 A1  | 2/1996 |
| JP | 09-148509 A1  | 6/1997 |

(Continued)

OTHER PUBLICATIONS

Japanese Office Action mailed Jul. 12, 2012.

(Continued)

*Primary Examiner* — Long K Tran
*Assistant Examiner* — Jordan Klein
(74) *Attorney, Agent, or Firm* — Burr & Brown, PLLC

(57) ABSTRACT

A circuit member includes a frame substrate formed, by patterning a rolled copper plate or a rolled copper alloy plate, with a die pad portion for a semiconductor chip to be mounted thereon, and a lead portion for an electrical connection to the semiconductor chip, having rough surfaces formed as roughed surfaces on upsides and lateral wall sides of the die pad portion and the lead portion, and smooth surfaces formed on downsides of the die pad portion and the lead portion, and the die pad portion and the lead portion are buried in a sealing resin, having a downside of the lead portion exposed.

7 Claims, 12 Drawing Sheets

(56) References Cited

U.S. PATENT DOCUMENTS

| | | | |
|---|---|---|---|
| 6,163,961 A * | 12/2000 | McMeekin | 29/898.056 |
| 6,201,292 B1 * | 3/2001 | Yagi et al. | 257/666 |
| 6,221,696 B1 | 4/2001 | Crema et al. | |
| 6,706,975 B2 | 3/2004 | Sumi et al. | |
| 6,808,825 B2 * | 10/2004 | Nagai | 428/626 |
| 6,831,372 B2 * | 12/2004 | Ruhland | 257/783 |
| 7,049,683 B1 * | 5/2006 | Sirinorakul et al. | 257/666 |
| 7,190,057 B2 * | 3/2007 | Seki et al. | 257/678 |
| 7,205,180 B1 * | 4/2007 | Sirinorakul et al. | 438/123 |
| 2002/0038790 A1 | 4/2002 | Kurii et al. | |
| 2002/0153596 A1 * | 10/2002 | Tsubosaki et al. | 257/666 |
| 2004/0207056 A1 * | 10/2004 | Seki et al. | 257/676 |
| 2004/0232534 A1 * | 11/2004 | Seki et al. | 257/678 |
| 2006/0097366 A1 * | 5/2006 | Sirinorakul et al. | 257/666 |

FOREIGN PATENT DOCUMENTS

| | | |
|---|---|---|
| JP | 11-040720 | 2/1999 |
| JP | 2000-077594 A1 | 3/2000 |
| JP | 2002-256459 | 9/2002 |
| JP | 2002-280488 | 9/2002 |
| JP | 2002-309396 | 10/2002 |
| JP | 2003-158142 | 5/2003 |
| JP | 2003-158234 | 5/2003 |
| JP | 2004-349497 | 12/2004 |

OTHER PUBLICATIONS

Taiwanese Office Action (With English Summary), Taiwanese Application No. 095114961, dated Mar. 18, 2013 (13 pages).
Japanese Office Action (Application No. 2013-054618) dated Jan. 28, 2014.

* cited by examiner

CIRCUIT MEMBER, MANUFACTURING METHOD FOR CIRCUIT MEMBERS, SEMICONDUCTOR DEVICE, AND SURFACE LAMINATION STRUCTURE FOR CIRCUIT MEMBER

CROSS-REFERENCE TO RELATED APPLICATIONS

This application is a divisional of U.S. patent application Ser. No. 11/912,163 filed Nov. 16, 2007, which was the National Stage of International Application No. PCT/JP2006/308721 filed Apr. 26, 2006, and claims the priority of Japanese Patent Application No. 2005-128259 filed Apr. 26, 2005, the entireties of which are incorporated herein by reference.

FIELD OF THE INVENTION

The present invention relates to a lamination structure for circuit member surfaces, and a surface treating technique for a lead frame as a circuit member, as well as a semiconductor device using the circuit member, and particularly, to a technique for enhancement of strength in adhesion between a lead frame and a sealing resin in accordance with a type of semiconductor package.

BACKGROUND OF THE INVENTION

The semiconductor device may be a semiconductor package with a structure having a semiconductor chip, such as an IC chip or LSI chip, mounted on a lead frame, and sealed with an insulating resin. For such semiconductor devices, along with advancements in high-integration and miniaturization, their package structures have developed through such types that had an external lead projecting out of a lateral wall of a resin package, as in an SOJ (small outline J-leaded package) and a QFP (quad flat package), to such types that have an external lead buried for exposure at the backside of a resin package, without projecting outside, and are thin and need a small implementation area, as in a QFN (quad flat non-leaded package) and an SON (small outline non-leaded package).

As lead frames, there are known those (e.g. Japanese Patent Application Laying-Open Publication No. 11-40720 (page 4, FIG. 1): patent material-1) having a structure in which, for a frame substrate to be sealed with an insulating resin, its surfaces are treated for a roughing, and a nickel (Ni) layer and a palladium (Pd) layer are laminated in this order on the surfaces by a plating method. As a method for the roughing process, substrate surfaces of lead frame are chemically polished by an etching solution of an organic acid system.

As other known lead frames, there are those (e.g. Japanese Patent Application Laying-Open Publication No. 2004-349497 page 7, FIG. 3): patent material-2) in which frame substrate surfaces are covered with a plated Ni skin roughed at the obverse side. Formation of such a roughed Ni skin is allowed by adjusting a condition of the plating method.

Such being the case, the combination of formation of a plated Ni skin over the surface of a lead frame and provision of Pd or Au plated thereon has a wide use for manufacturing processes to be simplified, and environment-oriented processes to be free of Pb.

Further, as circuit members to be brought into close contact with an insulating resin, among others besides lead frames, there are e.g. conductor plates or bus bars of connectors employable in an electrical connection box for distribution of a vehicular power supply to vehicle-mounted auxiliary equipment.

SUMMARY OF THE INVENTION

However, the etching solution of organic acid system in the above-noted patent material-1 is effective to a copper surface formed by a plating method, but is little effective for roughing surfaces of a rolled copper plate that is a substrate of lead frame, as a problem. In fact, when treated with such an etching solution of organic acid system, the surface of rolled copper substrate has a raised surface roughness, with a surface profile failing to be needle-shaped. Hence, for lead frames treated for roughing with an etching solution of organic acid system, it was difficult to expect a great effect with respect to the adhesion to an insulating resin constituting a package. In addition, the surface roughing with an etching solution of organic acid system needs an etching to a 3-µm depth from the copper surface to give a surface roughness (Ra) of 0.15 µm, and has to make the deeper etching for a greater surface roughness. Such a treating method thus takes time for etching, and has not been adaptive for production a practical lead frame.

The above-noted patent material-2 describes a plating method, by which a surface-roughed Ni skin may be formed, but in such a method, the Ni skin needs to be thick to raise the surface roughness, which should be 1 µm or more to provide a stable effect. However, recent trends demand a thin metallic skin, and a Ni skin thickness about 5 µm is desirable.

By the way, in lead frames applied to semiconductor devices of such a type that is thin and small of implementation area, like QFN or SON, a downside surface of an external lead is exposed at the downside of a resin package, with a resultant small contact area between the external lead and an insulating resin. It therefore is necessary to provide the more enhanced adhesion strength between lead frame and insulating resin. Recent years have observed an increased demand for semiconductor devices addressed to vehicle-mounting, while such applications undergo vibrations as well as temperature variations, needing a greater adhesion strength between lead frame and insulating resin than ever.

Further, lead frames are desired to have a matching function to the package type, taking into consideration, among others, those regions of internal leads to be wire-bonded, and those regions of external leads to be soldered to a board for implementation (printed wiring board).

It therefore is a main object of the present invention to provide a lead frame allowing for enhancement of adhesion strength to a sealing resin, and a manufacturing method of the same, as well as a semiconductor device.

It is another object of the present invention to provide a lead frame applicable to a package type such as QFN or SON, and a manufacturing method of the same, as well as a semiconductor device.

It is still another object of the present invention to provide a surface lamination structure for a circuit member allowing for enhancement of adhesion strength to a sealing resin.

According to a first aspect of the present invention, a circuit member includes a frame substrate formed, by patterning a rolled copper plate or a rolled copper alloy plate, with a die pad portion having a surface for a semiconductor chip to be mounted thereon, and a lead portion for an electrical connection to the semiconductor chip, comprising rough surfaces formed on upper and lateral wall sides of the die pad portion and the lead portion, and the die pad portion and the lead portion having bottom surfaces as smooth surfaces, and being configured to be buried in a sealing resin, having a bottom of the lead portion exposed.

According to a second aspect of the present invention, a circuit member includes a frame substrate formed, by patterning a rolled copper plate or a rolled copper alloy plate, with a die pad portion with a surface for a semiconductor chip to be mounted thereon, and a lead portion for an electrical connection to the semiconductor chip, comprising smooth surfaces as a portion of an upper side of the die pad portion and a portion of an upper side of the lead portion to be connected to a bonding wire, metallic skins laminated on the smooth surfaces, and rough surfaces formed on regions excepting the bottom side of the die pad portion and the lead portion and regions where the metallic skins are formed.

Further, those portions of the circuit member to be brought into contact with a resin sealing mold may comprise smooth surfaces.

It is noted that in the present invention, the above-noted rough surfaces may preferably have a surface roughness (Ra) of 0.3 μm or more, and a laminated metallic skin may preferably comprise a Ni skin of a thickness within a range of 0.5 to 2 μm, a Pd skin of a thickness within a range of 0.005 to 0.2 μm, and an Au skin of a thickness within a range of 0.003 to 0.01 μm, as they are laminated in order. The above-noted rough surfaces may preferably be formed by treating by a micro-etching solution having hydrogen peroxide and sulfuric acid as components. Here, the micro-etching solution refers to a surface treating agent adapted for a slight dissolving of a metal surface to form a rough surface comprising minute undulations.

According to a third aspect of the present invention, a manufacturing method for circuit members comprises the steps of forming a frame substrate with a die pad portion and a lead portion, by patterning a rolled copper plate or a rolled copper alloy plate, roughing upside surfaces and lateral wall surfaces of the frame substrate, using a micro-etching solution having hydrogen peroxide and sulfuric acid as components, with a masking material covering bottom surfaces of the frame substrate, and having, past a removal of the masking material, metallic skins laminated on obverse surfaces of the frame substrate.

According to a fourth aspect of the present invention, a manufacturing method for circuit members comprises the steps of forming a frame substrate with a die pad portion and a lead portion, by patterning a rolled copper plate or a rolled copper alloy plate, laminating metallic skins on an upper surface of the die pad portion, and on a portion of the lead portion to be connected to a bonding wire, processing by surface-roughing the frame substrate, using a micro-etching solution having hydrogen peroxide and sulfuric acid as principal components, with a masking material covering bottom surfaces of the frame substrate, and removing the masking material.

The metallic skins laminated on the upside surface of the die pad portion and on the portion of the lead portion to be connected to the bonding wire may preferably each comprise an Ag skin within a range of 2 to 15 μm, or a metallic skin having a Ni skin and a Pd skin laminated in order on the frame substrate.

According to a fifth aspect of the present invention, a semiconductor device comprises a circuit member composed of a rolled copper plate or a rolled copper alloy plate, comprising a die pad portion and a lead portion, rough surfaces formed on upper and lateral wall sides of the die pad portion and the lead portion, smooth surfaces as downside surfaces of the die pad portion and the lead portion, and metallic skins formed on the surfaces, a semiconductor chip mounted on an upside of the die pad portion, a bonding wire interconnecting the semiconductor chip and the lead portion, and an electrically insulating sealing resin configured to have the circuit member, the semiconductor chip, and the bonding wire sealed in, with a downside of the lead portion exposed.

According to a sixth aspect of the present invention, a semiconductor device comprises a circuit member composed of a rolled copper plate or a rolled copper alloy plate, comprising a die pad portion and a lead portion, smooth surfaces as an upper surface of the die pad portion and a portion of an obverse side surface of the lead portion to be connected to a bonding wire, metallic skins laminated on the smooth surfaces, and rough surfaces formed on regions excepting reverse sides of the die pad portion and the lead portion and regions where the metallic skins are formed, a semiconductor chip mounted on the upside upper surface of the die pad portion, the bonding wire interconnecting the semiconductor chip and the lead portion, and an electrically insulating sealing resin configured to have the circuit member, the semiconductor chip, and the bonding wire sealed in, with a downside of the lead portion exposed.

According to a seventh aspect of the present invention, a surface lamination structure for a circuit member to be joined to an insulating resin comprises a rough surface formed on an obverse side of a conductive substrate composed of a rolled copper plate or a rolled copper alloy, with a surface roughness (Ra) of 0.3 μm or more, and a Ni skin and a Pd skin laminated in order on the rough surface, wherein the Ni skin has a thickness within a range of 0.5 to 2 μm, and the Pd skin has a thickness within a range of 0.005 to 0.2 μm.

DETAILED DESCRIPTION OF THE INVENTION

There will be detailed circuit members, manufacturing methods for circuit members, semiconductor devices, and surface lamination structures for circuit members according to embodiments of the present invention, with reference to the drawings. It is now noted that the drawings are schematic, and for respective material layers, the thickness, its ratio, etc. are different from practical ones. Specific thickness and dimensions should thus be decided in consideration of the following description. Further, drawings may involve also such parts as mutually different in between in dimensional relationship or ratio, as a matter of course.

[First Embodiment]

Figure 1:
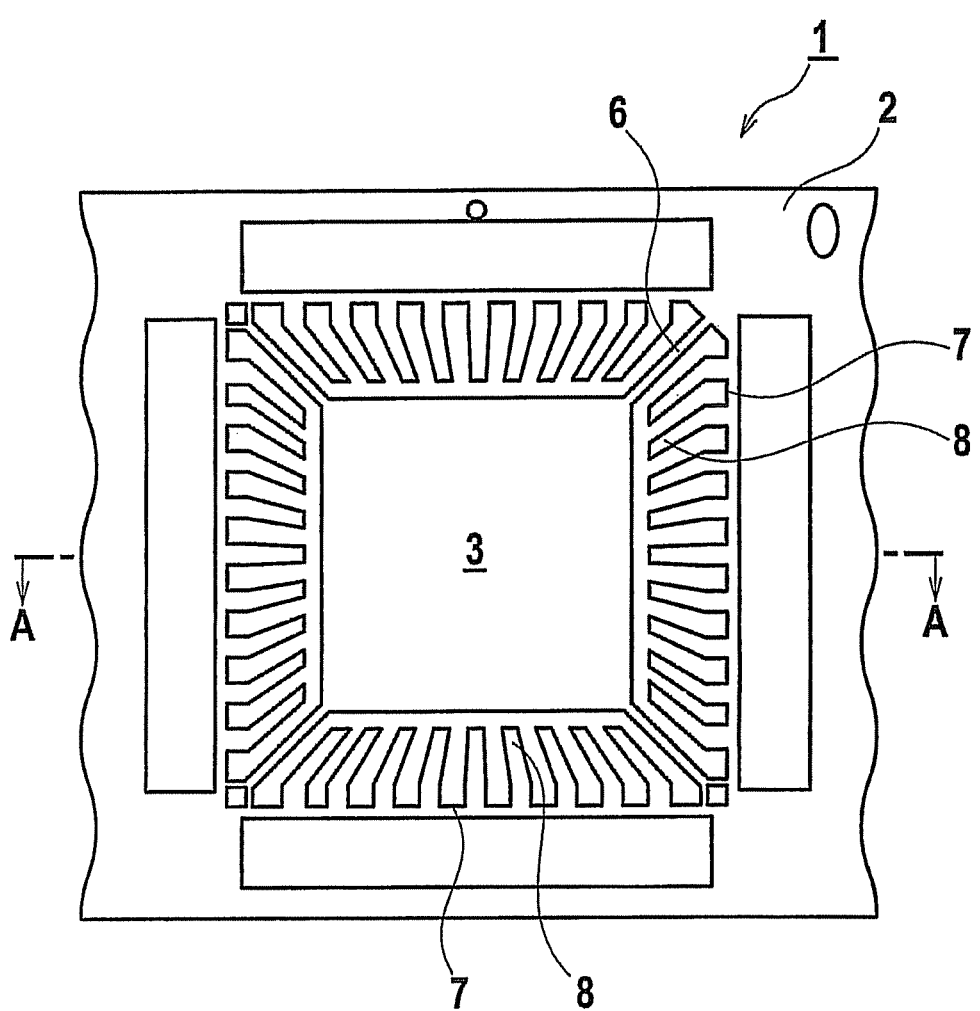
FIG. 1 is a plan view of a lead frame according to a first embodiment of the present invention.

FIG. 1 to FIG. 9 show a first embodiment of the present invention. FIG. 1 is a plan view of a lead frame, and FIG. 2 to FIG. 9 illustrate processes in a manufacturing method of the lead frame, as well as of a semiconductor device, with respect to a section A-A of FIG. 1.

(Configuration of Lead Frame)

According to the present embodiment, a lead frame 1 is manufactured in the form of a frame substrate 2 as a rolled copper plate or rolled copper alloy plate of an elongate ribbon shape that is patterned by, among others, an etching or a die-blanking, to have a plurality of consecutive unit patterns. It is noted that FIG. 1 shows a single unit pattern in the lead frame 1.

As shown in FIG. 1, the unit pattern of lead frame 1 has a die pad portion 3 formed, in a central region, in a rectangular shape for a semiconductor chip to be mounted thereon, a set of lead portions 8 formed so as to surround the die pad portion 3, a set of tie bars 6 linking the die pad portion 3 with the frame substrate 2, and a set of tie bars 7 laterally interlinking lead portions 8. Those lead portions 8 are set in such sizes that will not project out of a lateral wall of a sealing resin 15, as will be described. It is noted that this embodiment, which is formed with tie bars 7 laterally interlinking lead portions 8, may be modified by omission of tie bars 7, to such a pattern that has lead portions 8 extending from an outer frame part of the frame 2 toward a periphery of the die pad portion 3.

Figure 4:
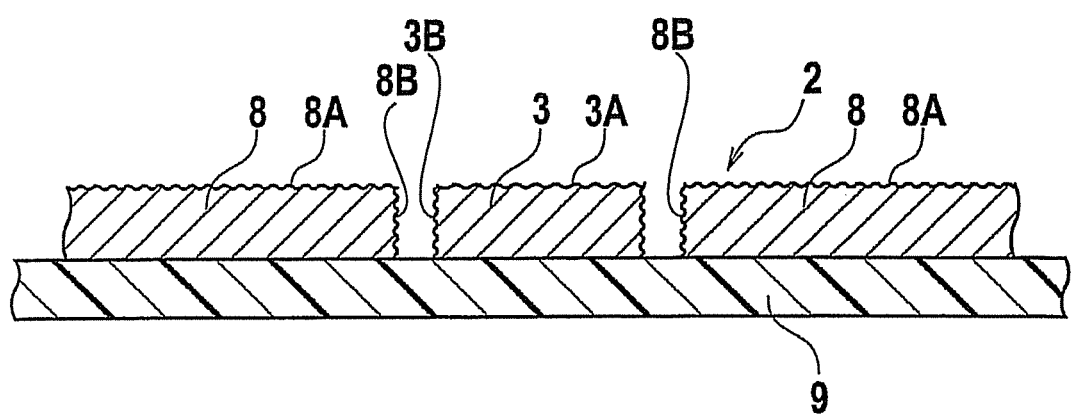
FIG. 4 is a sectional view illustrating a process of the manufacturing method of the lead frame according to the first embodiment of the present invention.
Figure 5:
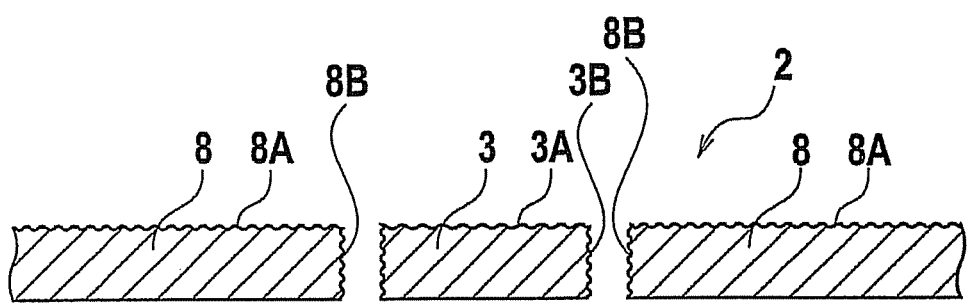
FIG. 5 is a sectional view illustrating a process of the manufacturing method of the lead frame according to the first embodiment of the present invention.

For the lead frame 1 according to the present embodiment, upside surfaces (surfaces at that side on which a semiconductor chip is to be mounted) as well as lateral wall surfaces are treated for a roughing by using a micro-etching solution including hydrogen peroxide and sulfuric acid as principal components, to provide rough surfaces 3A and 3B as well as 8A and 8B, as shown in FIG. 4 and FIG. 5. For these rough surfaces 3A, 3B and 8A, 8B, the surface roughness (Ra) is set within a range of 0.3 μm or more, and their surface profiles are undulated with needle-shaped projections. The frame substrate 2 has downside (bottom) surfaces (surfaces at the opposite side to the semiconductor chip mounting side) formed as smooth surfaces.

Figure 6:
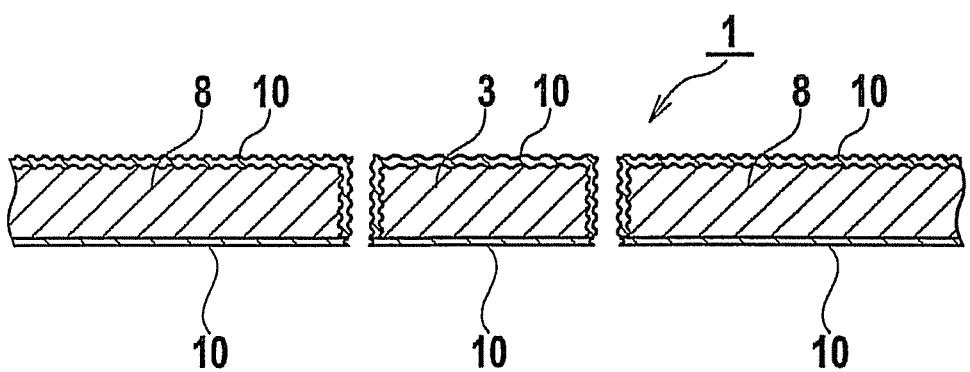
FIG. 6 is a sectional view illustrating a process of the manufacturing method of the lead frame according to the first embodiment of the present invention.
Figure 10:
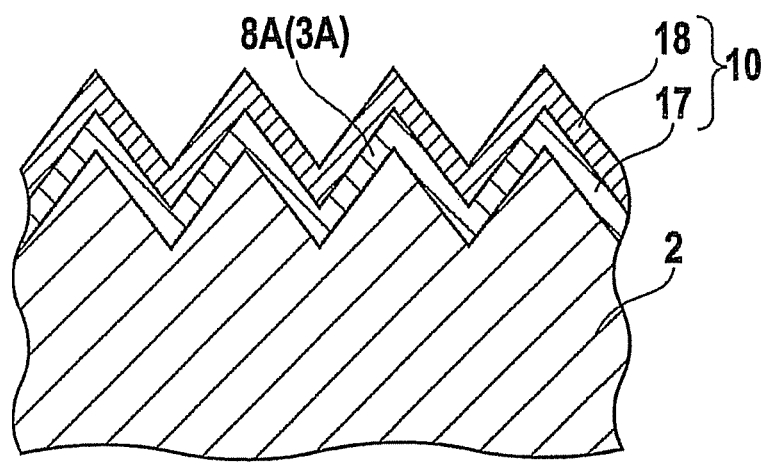
FIG. 10 is an enlarged sectional view of a roughed portion of a lead frame according to an embodiment of the present invention.

Further, as shown in FIG. 6, metallic skins 10 are plated on surfaces of the frame substrate 2 including die pad portions 3, lead portions 8, etc. It is noted that in this embodiment, as shown in FIG. 10, each metallic skin 10 is composed of a Ni skin 17 and a Pd skin 18 laminated in this order on surfaces of the frame substrate 2. And the thickness is set within a range of 0.5 to 2 μm for the Ni skin 17, and within a range of 0.0055 to 0.2 μm for the Pd skin 18. It also is noted that the Pd skin 18 is a metallic layer having a good property for connections to a bonding wire and solder paste, allowing for integrities in, among others, a wire bonding for connection of a bonding wire 13 shown in FIG. 7, and a soldering to an unshown board for implementation (a printed wiring board).

In such the configuration of lead frame 1, for rough surfaces 3A, 3B and 8A, 8B, the surface roughness (Ra) is set within a range of 0.3 μm or more, and ranges of thickness are set for Ni skin 17 and Pd skin 18 constituting each metallic skin 10, thereby allowing a secured configuration of needle-shaped projections of surfaces coated with metallic skins 10, without breaking surface profiles of rough surfaces 3A, 3B and 8A, 8B. Therefore, when the lead frame 1 is sealed with a resin, minute projections involving metallic skin 10 may exhibit anchoring effects to bite in the sealing resin.

(Manufacturing Method of Lead Frame)

Description is now made of a manufacturing method of a lead frame according to the present embodiment, with reference to FIG. 2 to FIG. 6.

Figure 2:
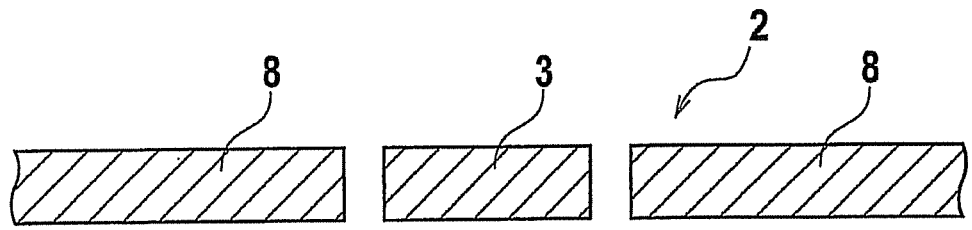
FIG. 2 is a sectional view illustrating a process of a manufacturing method of the lead frame according to the first embodiment of the present invention.

In this embodiment, there is first provided a frame substrate 2 formed with die pad portions 3, lead portions 8, etc., as shown in FIG. 2. For the frame substrate 2 (a rolled copper alloy plate), the constituent material to be employed may be, e.g., a Mitsubishi Metex make, low-tin, Ni-copper alloy MF202.

Figure 3:
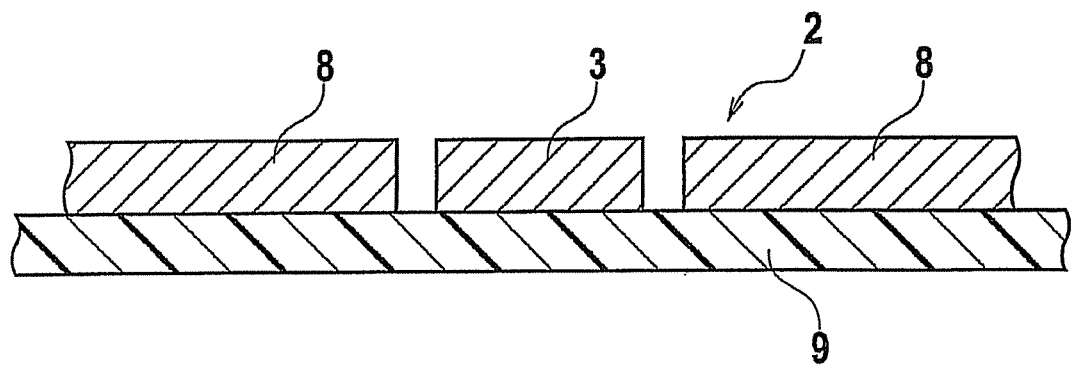
FIG. 3 is a sectional view illustrating a process of the manufacturing method of the lead frame according to the first embodiment of the present invention.

Next, as shown in FIG. 3, the frame substrate 2 has a protecting film 9 laminated as a masking material on a downside (one principal plane) thereof.

Then, those portions of the frame substrate 2 not covered by the protecting film 9 are micro-etched for approximately 90 seconds, by dipping in a micro-etching solution including hydrogen peroxide and sulfuric acid as principal components, to form such rough surfaces 3A, 3B and 8A, 8B as shown in FIG. 4. These rough surfaces 3A, 3B and 8A, 8B have surface profiles undulated like precipitous needles. Such a roughing treatment resulted in an etching magnitude of 2 μm, a surface roughness (Ra) of 0.33 μm, and an S(−)ratio of 2.08 on rough surfaces 3A, 3B and 8A, 8B. It is noted that the etching magnitude means an average digging depth of etching. The Sratio represents a value of a surface area of undulating surface divided by an area of flat plane in a measured range.

Thereafter, as shown in FIG. 5, the protecting (masking material) film 9 is separated, and such metallic skins 10 as shown in FIG. 6 are formed. It is noted that the metallic skins 10 are each composed of a Ni skin 17 and a Pd skin 18 laminated in this order on surfaces of the frame substrate 2, as described. It also is noted that the method to be employed for formation of metallic skin 10 may be a well-known method, such as an electrolytic plating or electroless plating. Here, the growth of metallic skin is controlled so that the Ni skin 17 has a thickness within a range of 0.5 to 2 μm, and the Pd skin 18 has a thickness within a range of 0.005 to 0.2 μm. Like this, manufacture of a lead frame is completed.

According to the present embodiment, the manufacturing method of lead frame can have a shorter etching time, and an enhanced productivity. Further, thin metallic skins 10 allow for a reduced consumption of an expensive plating solution.

Figure 7:
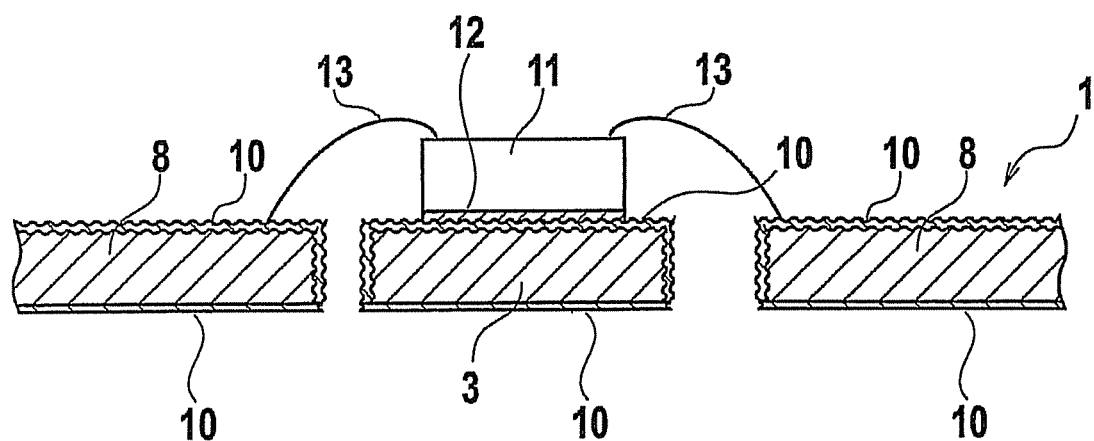
FIG. 7 is a sectional view illustrating a process of a manufacturing method of a semiconductor device according to the first embodiment of the present invention.
Figure 8:
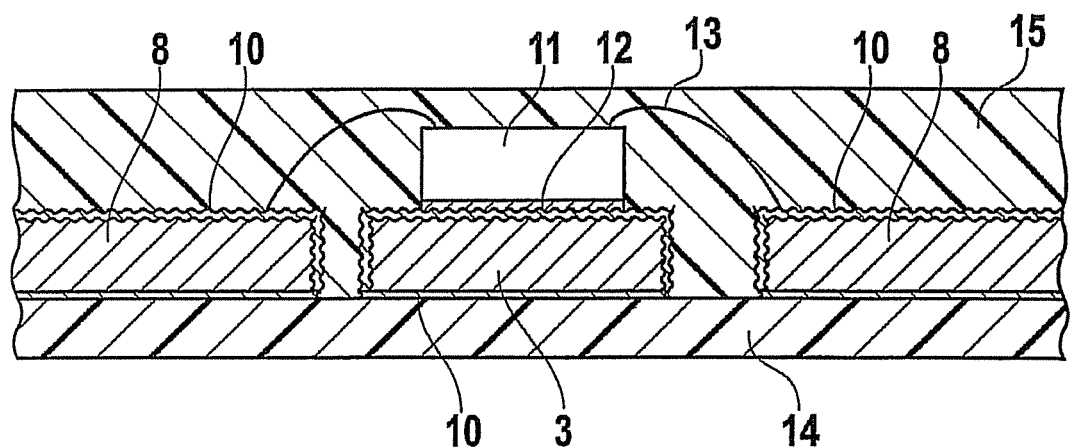
FIG. 8 is a sectional view illustrating a process of the manufacturing method of the semiconductor device according to the first embodiment of the present invention.
Figure 9:
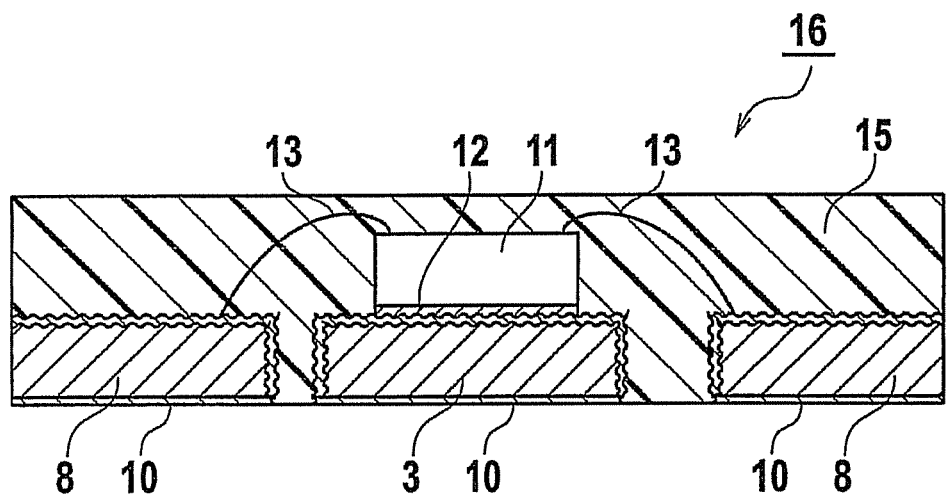
FIG. 9 is a sectional view of the semiconductor device according to the first embodiment of the present invention.

Description is now made of a manufacturing method of a semiconductor device, as well as configuration of the semiconductor device, with reference to FIG. 7 to FIG. 9.

As shown in FIG. 7, a semiconductor chip 11 is mounted, via a paste agent 12, on an upper surface of a die pad portion of a lead frame 1 manufactured by the above-noted manufacturing method. Thereafter, by way of a wire bonding, lead portions 8 are connected, by bonding wires 13, at their distal ends to corresponding electrodes of the semiconductor chip 11. Next, as shown in FIG. 8, the lead frame 1 has a resin leak preventing protection film 14 laminated on a bottom thereof, and the entirety is molded with a sealing resin 15 made of, e.g., an epoxy resin. Thereafter, the combination of sealing resin 15 and lead frame 1 is cut (diced) in a desirable form, whereby such a semiconductor device (semiconductor package) 16 as shown in FIG. 9 is finished up.

In the semiconductor device 16 of this embodiment, downside surfaces of die pad portion 3 and lead portions 8 are exposed at a bottom of the sealing resin 15. Exposed lead portions 8 are to be each connected by a soldering to an end of an unshown board for implementation (a printed wiring board).

For such the configuration of semiconductor device 16 in which obverse surfaces of die pad portion 3 and lead portions 8 are roughed, excepting bottom surfaces, their adhesion strength to the sealing resin 15 is high, affording a durability against vibrations and temperature variations.

Description is now made of a comparison between a case of a roughing treatment to a rolled copper alloy plate according to the present embodiment, and a case of treatment in an organic acid system.

Compared in Table-1 below are combinations of etching magnitude, surface roughness (Ra), Sratio, and etching time in an example of surface treatment using a micro-etching solution including hydrogen peroxide and sulfuric acid as principal components in accordance with the present embodiment, and in comparative examples using an organic acid system (where CZ8100® is employed) as in the past. Comparative examples are enumerated for etching magnitudes of 1 µm, 2 µm, and 3 µm.

TABLE 1

| Treating solution | Hydrogen peroxide + sulfuric acid | Comparative examples by organic acid system (C28100) | | |
|---|---|---|---|---|
| Etching magnitude | 2 µm | 1 µm | 2 µm | 3 µm |
| Roughness (Ra) | 0.33 µm | 0.085 µm | 0.105 µm | 0.152 µm |
| Sratio | 2.08 | 1.11 | 1.13 | 1.20 |
| Etching time | approx. 1.5 min | approx. 3 min | approx. 6 min | approx. 9 min |

It will be seen from comparative examples in the Table-1 above that the use of organic acid system needs an etching of 3 µm depth to obtain a roughness of 0.15 µm. As will be seen therefrom, it is necessary for a greater roughness to make a deeper etching, taking time for the etching, with a resultant non-conformity to production of a practical lead frame. To the contrary, in a surface treatment according to the present embodiment, it is possible to obtain a roughness of comparative example times two or more by an etching depth of 2 µm. In the present embodiment, the surface treatment is effected by using a micro-etching solution including hydrogen peroxide and sulfuric acid as principal components, allowing for provision of a surface configuration with minute needle-shaped undulations. This configuration is considered effective to achieve a greater anchoring effect than would be supposed from a numerical representation of parameter.

Figure 11:
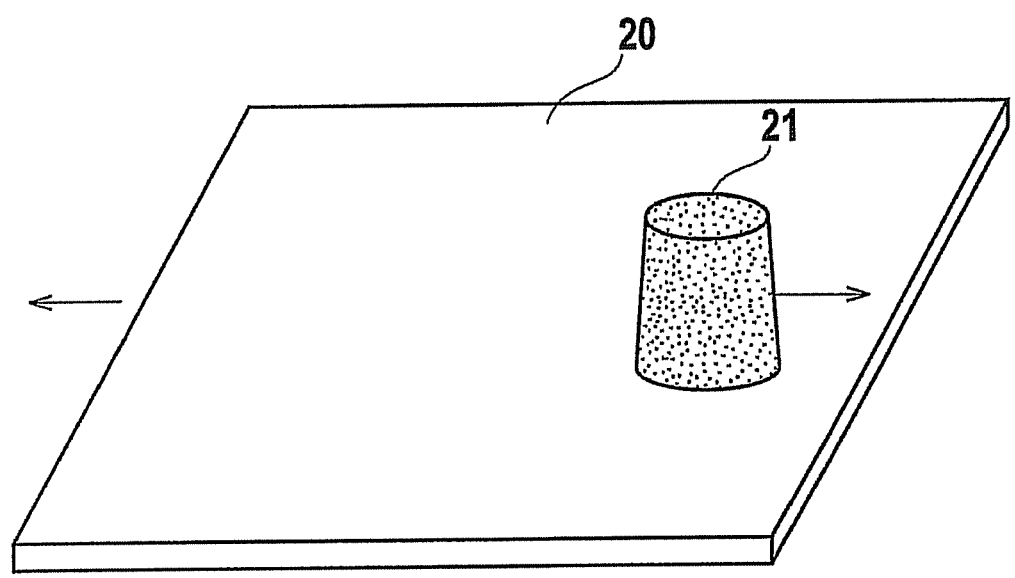
FIG. 11 is a perspective view illustrating an outline of an adhesion strength test.

For a measurement of adhesion strength to a sealing resin in the present embodiment, such a cup shearing strength as shown in FIG. 11 was measured. On a rolled copper alloy plate of a copper alloy (MF202), a metallic skin like the above-noted was formed, and a discoloration preventing process was provided, whereby an adhesion strength test piece 20 was made. This adhesion strength test piece 20 was heated once at 220° C. for 60 seconds on a hot plate, and thereafter, additionally, at 220° C. for 60 seconds on the hot plate, and further, at 240° C. for 80 seconds on the hot plate. For the molding, a heating under a pressure of 125 kg/cm² was performed at 175° C. for 120 seconds. Thereafter, an additional heating was performed at 175° C. for 5 hours, whereby an epoxy resin 21 was hardened.

On thus molded epoxy resin 21 and adhesion strength test piece 20, a load was imposed in a direction of arrows shown in FIG. 11, and the load when they were separated was divided by the area of joint surface, to determine a load (kN/cm²) per unit area.

As a result of this, the following values were given as values of shearing strength, proving that a roughing process according to the present embodiment had an enhancing effect on the adhesion strength to sealing resin.

(1) 0.04 kN/cm² for no roughing
(2) 0.42 kN/cm² for a roughing without anti-corrosion process
(3) 0.54 kN/cm² for a roughing with a silane series anti-corrosion process

[Second Embodiment]

Figure 12:
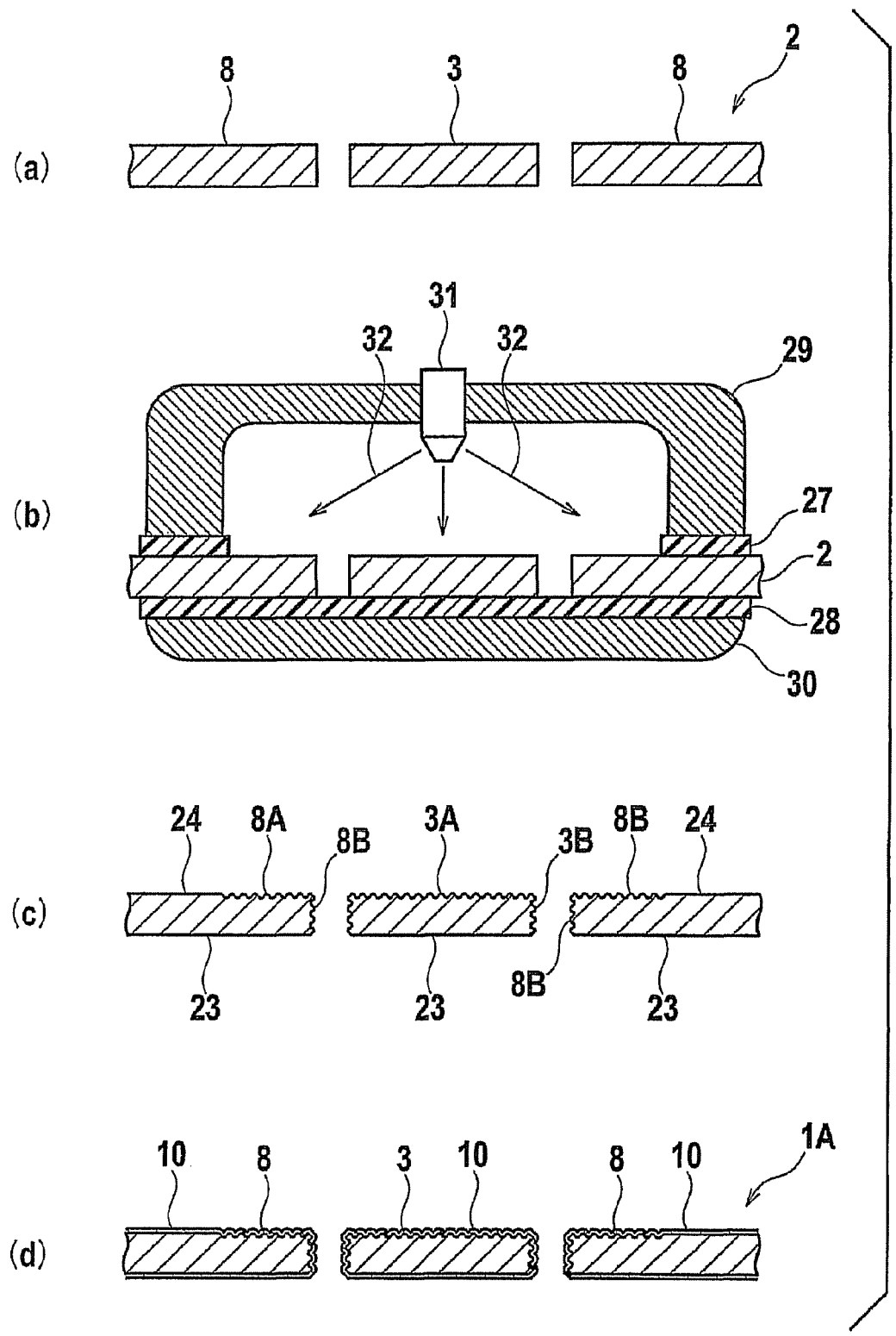
FIGS. 12(a) to (d) are sectional views illustrating a sequence of manufacturing processes of a lead frame according to a second embodiment of the present invention.
Figure 13:
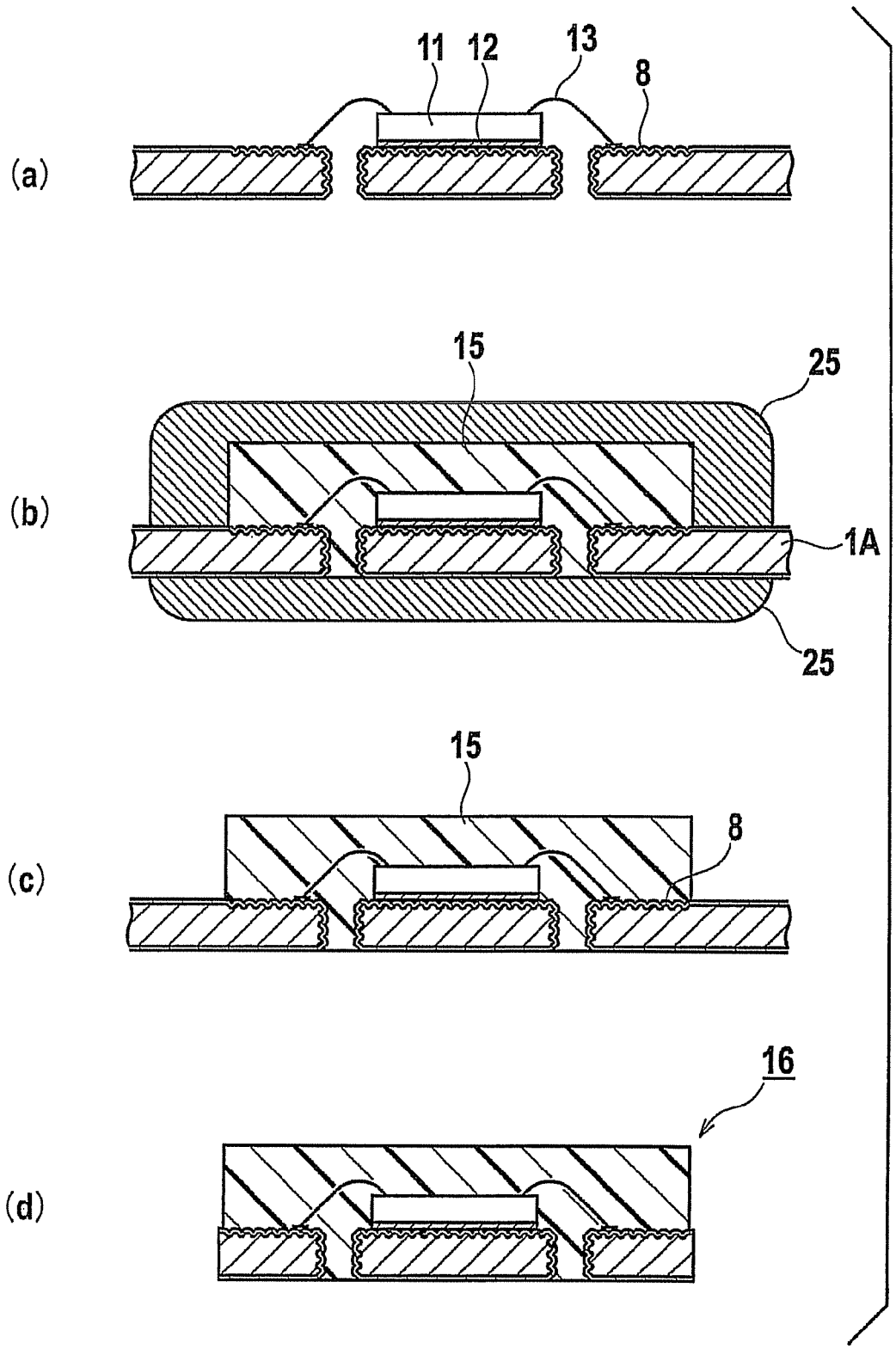
FIGS. 13(a) to (d) are sectional views illustrating a sequence of manufacturing processes of a semiconductor device according to the second embodiment of the present invention.

Description is now made of a second embodiment of the present invention, with reference to FIG. 12 and FIG. 13. It is noted that in this embodiment, like parts to the first embodiment are designated by like reference characters, for elimination of redundancy.

According to the second embodiment, for a lead frame as a circuit member, those surface portions to be brought into contact with a resin sealing mold are made smooth, and the remaining surface portions are roughed, to effect prevention of resin leakage and occurrences of resin burrs when molding the sealing resin. FIG. 12(a) shows a section of a frame substrate 2 patterned like FIG. 2. For the partial roughing, as shown in FIG. 12(b), instead of the method of laminating a protecting film on a bottom of a frame substrate 2 described with reference to FIG. 3, there is employed a method of pinching a frame substrate 2 by a pair of upper and lower etching jigs 29 and 30, with rubber packing elements 27 and 28 put in between, and injecting a micro-etching solution 32 from a nozzle 31 provided through the etching jig 29, for a prescribed period of time, onto the frame substrate 2 to be micro-etched for surface roughing.

In this occasion, the rubber packing element 28, which covers a bottom of the frame substrate 2, and the rubber packing element 27, which covers those surface portions of an upper side of the frame substrate 2 to be brought into contact with the resin sealing mold, serve as masking materials for protection against micro-etching of those surface portions of the frame substrate 2 to be left smooth.

FIG. 12 (c) shows the frame substrate 2 in a condition after the etching, where it is taken out of the etching jigs, and bottom surfaces 23 and portions 24 of upper surfaces having been covered by the rubber packing element 27 (i.e. the surface portions to be brought into contact with the resin sealing mold) are left as smooth surfaces, and the remaining surfaces are formed as rough surfaces 3A, 3B and 8A, 8B.

Next, as shown in FIG. 12(d), metallic skins 10 are plated on surfaces of the frame substrate 2 including a die pad portion 3 and lead portions 8, like the first embodiment.

FIG. 13 shows a sequence of processes using such a lead frame 1A for manufacture of a semiconductor device. For the lead frame 1A, as shown in FIG. 13(a), a semiconductor chip 11 is mounted on an upside of a die pad portion, with a paste agent 12 in between, and then, by way of a wire bonding, lead portions 8 are connected by bonding wires 13 to corresponding electrodes of the semiconductor chip 11.

Next, as shown in FIG. 13(b), using a resin sealing mold 25, they are molded with a sealing resin 15. FIG. 13(c) shows a condition after the resin molding, where the lead frame is taken out of the resin sealing mold 25. Under this condition, unnecessary parts of lead portions are cut in a desirable form, whereby the semiconductor (semiconductor package) is finished up, as in FIG. 13(d). It is noted that this embodiment provides an illustrative example of individual molding, involving no dicer cutting processes for a dicing such as in a lump molding.

In the resin molding by the sealing resin in FIG. 13(b), if those surface portions of the lead frame 1A contacting the resin sealing mold 25 were rough, the resin sealing mold 25 and the lead frame 1A might have had gaps in between, where sealing resin might have intruded, forming burrs, or sealing resin might have leaked outside the mold in an extreme case. In the present embodiment in which also roughed surface portions do provide like effects to the first embodiment, those surface portions of the lead frame 1A to be brought into contact with the resin sealing mold 25 are formed as smooth surfaces, and the resin sealing mold 25 is in close contact with the lead frame 1A, with an effect to prevent resin burrs or resin leakage.

[Third Embodiment]

Figure 15:
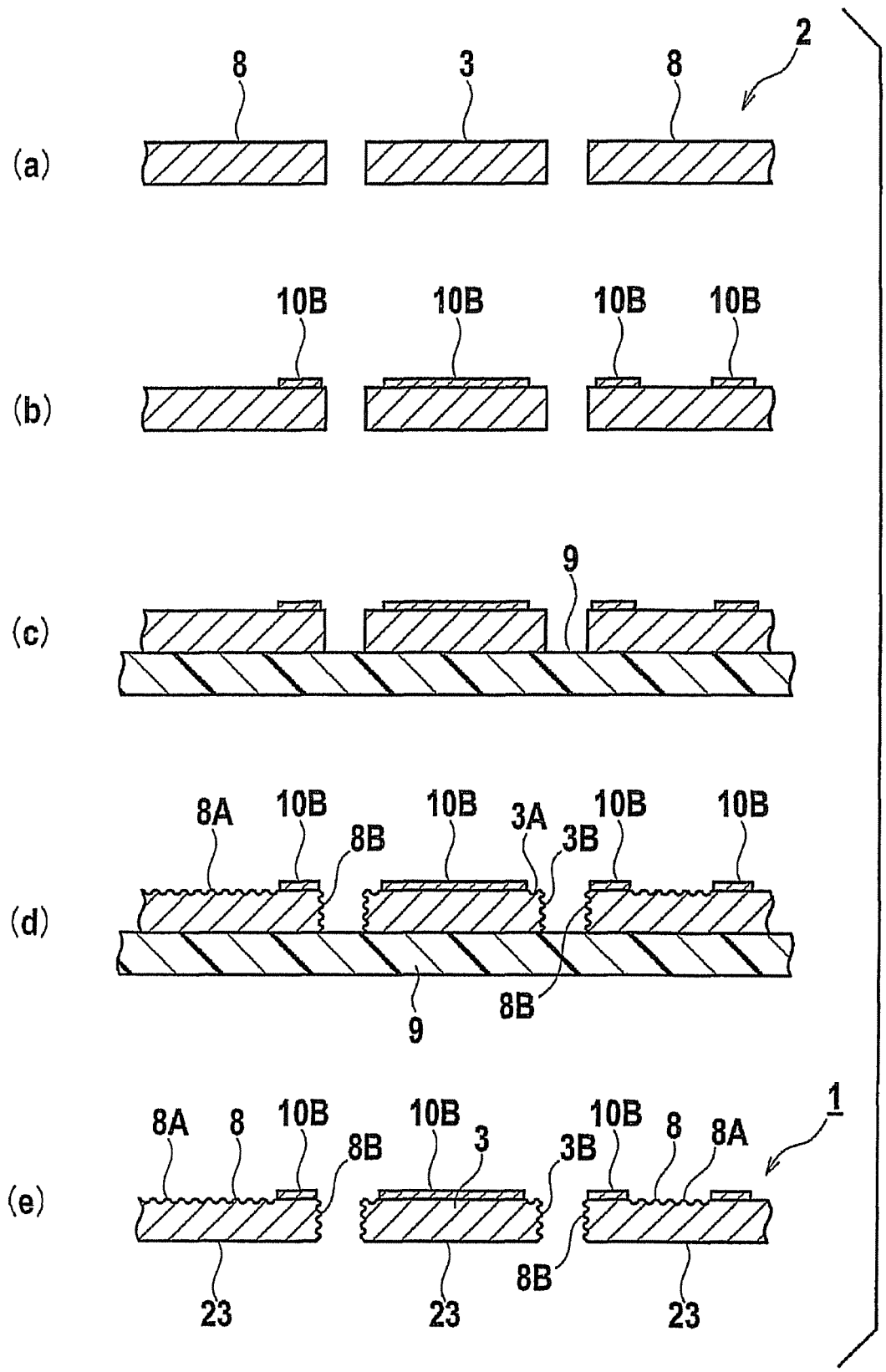
FIGS. 15(a) to (e) are sectional views illustrating a sequence of manufacturing processes of a lead frame according to a third embodiment of the present invention.
Figure 16:
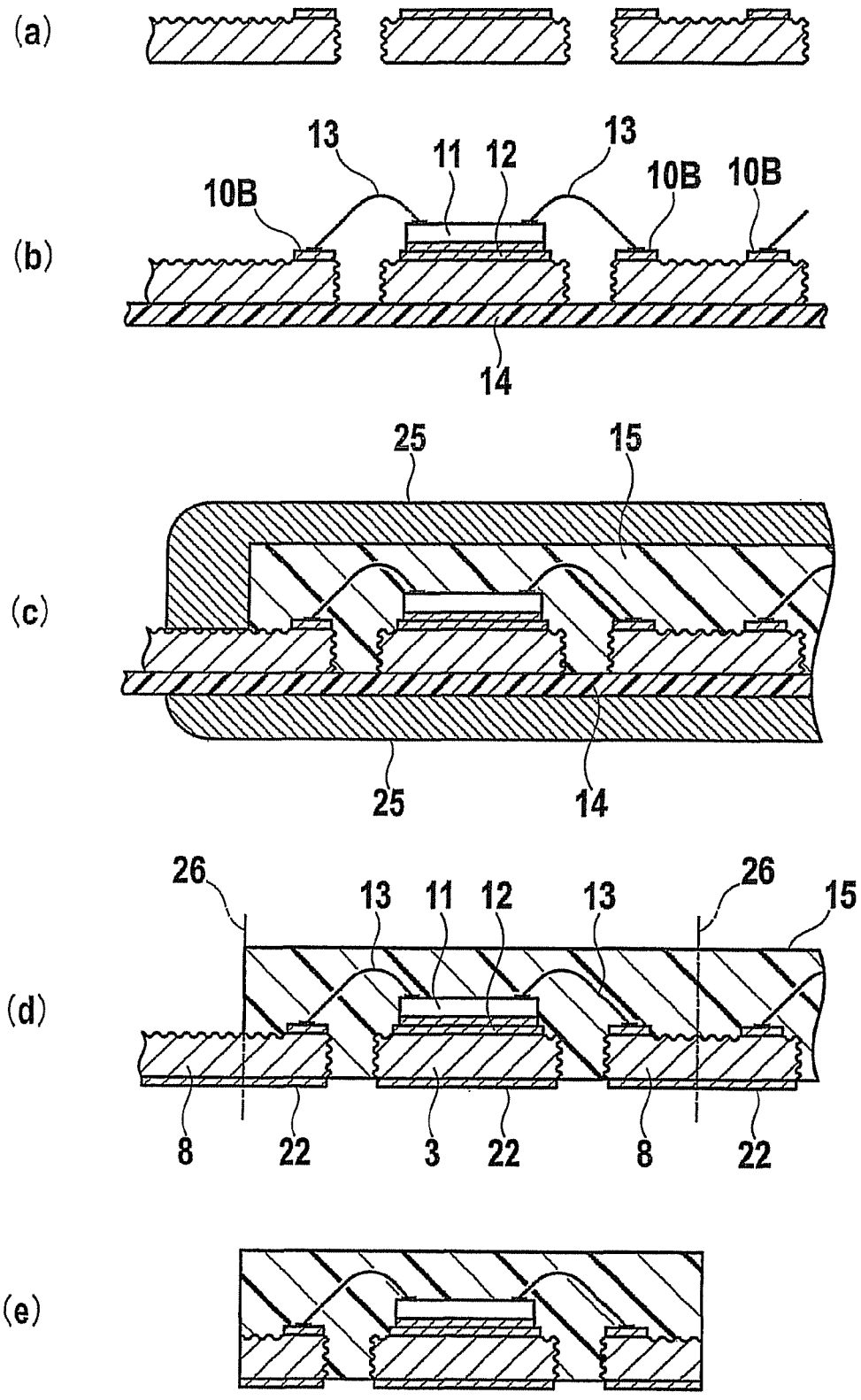
FIGS. 16(a) to (e) are sectional views illustrating a sequence of manufacturing processes of a semiconductor device according to the third embodiment of the present invention.

Description is now made of a circuit member according to a third embodiment of the present invention, with reference to FIG. 15 and FIG. 16. It is noted that in this embodiment, like parts to the first embodiment are designated by like reference characters, for elimination of redundancy.

This embodiment provides in advance a frame substrate 2 shown in FIG. 15(a), which is made of a rolled copper alloy, and has a prescribed pattern of lead frame formed thereon, including a die pad portion 3, lead portions 8, etc., by an etching or die-blanking.

Next, as shown in FIG. 15(b), precious-metal skins 10B are plated on a semiconductor chip mounting portion of a die pad upper surface and on bonding wire connecting portions of lead upside surfaces of the frame substrate 2, and as shown in FIG. 15(c), a protecting (masking material) film 9 is laminated on a bottom of the frame substrate 2.

Next, a micro-etching solution is injected over surfaces of the frame substrate 2, or the frame substrate 2 is dipped in a micro-etching solution for a prescribed time period (approximately 90 seconds), for a micro-etching to form such roughed surfaces 3A, 3B and 8A, 8B as shown in FIG. 15(d). In this state, those portions of surfaces of the frame substrate 2 where precious-metal skins 1 OB are plated, and those portions where the protecting film 9 is laminated are kept from the micro-etching, so that there are left surfaces of the frame substrate 2 per se, as they are smooth. FIG. 15(e) is a section of the lead frame 1, as it is past a removal of the protecting film 9, and is finished up, where precious-metal skins 10B have their smooth surfaces left as they are, as well as bottom surfaces 23, and other surfaces else than those are formed as rough surfaces 3A, 3B and 8A, 8B.

It is now noted that the precious-metal skins 10B are each composed of an Ag skin, or of an Ni skin and a Pd skin laminated in this order on a surface of the frame substrate 2.

FIG. 16 shows a sequence of processes for manufacturing a QFN (quad flat non-leaded package) using a lead frame manufactured by processes in FIG. 15 in accordance with the present invention. FIG. 16(a) shows a section of the lead frame having a multiplicity of unit patterns formed thereon corresponding to FIG. 15(e).

Next, as shown in FIG. 16(b), a resin burr preventing film is affixed to a bottom of the lead frame, as necessary, and a semiconductor chip 11 is mounted on an upper side of a die pad portion, with a paste agent 12 in between, and thereafter, by way of a wire bonding, lead portions 8 are connected by bonding wires 13 to corresponding electrodes of the semiconductor chip 11.

Next, as shown in FIG. 16(c), using a resin sealing mold (lump-molding mold) 25, they are lump-molded (resin-sealed) with a sealing resin 15.

Next, for an enhanced solder connectability in implementation, as shown in FIG. 16(d), solder skins 22 are plated on die pad portion and lead portions exposed in part outside the sealing resin, and then, the lump-molded lead frame is dicer-cut along dicing cut ways 26, whereby as shown in FIG. 16(e), an individual semiconductor device is finished up.

The third embodiment also exhibits like effects to the first embodiment. It is noted that in this embodiment, metallic skins are plated simply on a semiconductor chip mounting surface as well as on wire bonding surfaces, and a bottom of each lead portion to be soldered has a solder skin plated thereon, thus allowing for a saving of an expensive precious-metal plating solution, a controlled low production cost, and an enhanced wire bondability as well as mountability of semiconductor chip 11.

[Surface Lamination Structure for Circuit Members]

Figure 14:
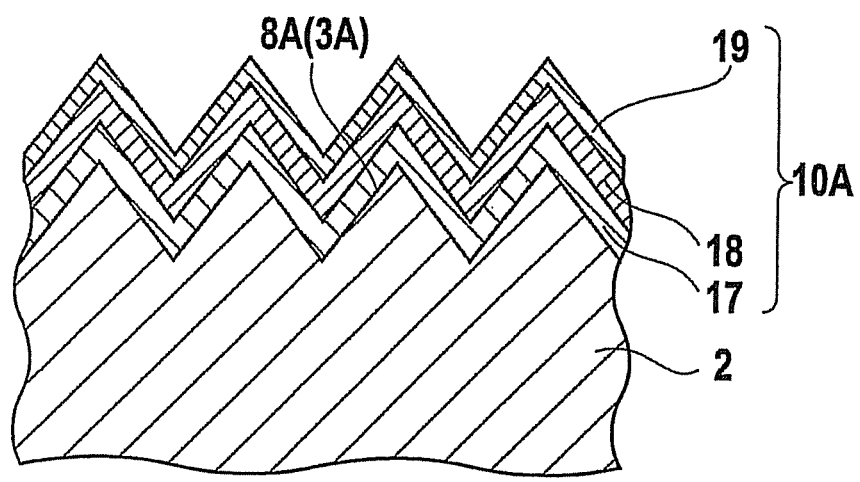
FIG. 14 is an enlarged sectional view of a roughed portion of a lead frame according to another embodiment of the present invention.

Description is now made of a surface lamination structure for circuit members according to the present invention, with reference to FIG. 10. On an obverse side of a frame substrate 2 as a conductive material composed of a rolled copper plate or a rolled copper alloy plate, there is a rough surface 8A formed with a roughness of 0.3 µm or more, where a Ni skin 17 and a Pd skin 18 are laminated in this order. Preferably, the thickness of Ni skin should range 0.5 to 2 µm, and that of Pd skin, 0.005 to 0.2 µm. Such a surface lamination structure affords an enhanced adhesion strength between conductive material and insulating resin. Further, as shown in FIG. 14, there may be an Au skin 19 plated for lamination on the Pd skin 18, with a thickness within a range of 0.003 to 0.01 µm. Such the Au skin is effective to prevent an oxide film from being formed on the Pd skin.

[Other Embodiments]

Such drawings and description as part of disclosure of the foregoing embodiments should not be construed restrictive to the present invention. For artisan, varieties of substitute modes of embodiment, embodiment examples, and techniques for implementation will become apparent from such disclosure.

For example, the first, second, and third embodiment, in which the metallic skin 10 is formed as a lamination of a single layer of Ag skin, or double layers of Ni skin 17 and Pd skin 18, may be modified to have a metallic skin 10A formed as a lamination with an additional Au skin 19 plated on the Pd skin 18, as in the surface lamination structure for circuit members shown in FIG. 14. It is noted that, preferably, the Au skin 19 should have a thickness within a range of 0.003 to 0.01 µm.

The foregoing first, second, and third embodiment, which are addressed to package types thin and small of implementation area, such as QFN and SON, may well be addressed to such types of lead frames as SOP and FLGA, allowing for an enhanced adhesion strength to sealing resin.

Further, the foregoing first, second, and third embodiment, in which a lead frame is applied for description of a circuit member, may be addressed to such circuit members as conductor plates or bus bars of connectors employable in an electrical connection box for distribution of a vehicular power supply to vehicle-mounted auxiliary equipment.

The invention claimed is:

1. A manufacturing method for circuit members, comprising:
   forming a frame substrate with a die pad portion and a lead portion, by patterning a rolled copper plate or a rolled copper alloy plate;
   roughing upside surfaces and lateral wall surfaces of the frame substrate, using a micro-etching solution having hydrogen peroxide and sulfuric acid as components, with a making material covering bottom surfaces of the frame substrate; and
   after a removal of the masking material, laminating metallic skins on the roughed upper surfaces, the roughed lateral wall surfaces and the bottom surface of the frame substrate simultaneously so that the metallic skins on roughed upper surfaces and the roughed lateral wall surfaces of the frame substrate have needle-shaped projections.

2. The manufacturing method for circuit members as claimed in claim 1, wherein the step of laminating the metallic skins comprises laminating an Ag skin on an obverse surface of the frame substrate.

3. The manufacturing method for circuit members as claimed in claim 1, wherein the step of laminating the metallic skins comprises laminating a Ni skin and a Pd skin in order on an obverse surface of the frame substrate.

4. The manufacturing method for circuit members as claimed in claim 3, comprising laminating an Au skin on the Pd skin.

5. A manufacturing method for circuit members, comprising:
   forming a frame substrate with a die pad portion and a lead portion, by patterning a rolled copper plate or a rolled copper alloy plate;
   laminating metallic skins on a semiconductor chip mounting portion of an upper surface of the die pad portion, and on a portion of the lead portion to be connected to a bonding wire;
   roughing upper surfaces and lateral surfaces of the die pad portion and the lead portion so as to selectively maintain a smooth surface of the semiconductor chip mounting portion, using a micro-etching solution having hydrogen peroxide and sulfuric acid as principal components, with a masking material covering entire bottom surfaces of the die pad portion and the lead portion; and
   removing the masking material.

6. A manufacturing method for a semiconductor device, comprising:
   forming a frame substrate with a die pad portion and a lead portion, by patterning a rolled copper plate or a rolled copper alloy plate;
   roughing upper surfaces and lateral wall surfaces of the die pad portion and the lead portion, using a micro-etching solution having hydrogen peroxide and sulfuric acid as components, with a masking material covering bottom surfaces of the die pad portion and the lead portion and a part of the upper surfaces of the lead portion to be brought into contact with a resin sealing mold so as to maintain smooth surfaces;
   after removal of the masking material, laminating metallic skins on obverse surfaces of the die pad portion and the lead portion;
   mounting a semiconductor chip on the upper surface of the die pad portion;
   connecting the semiconductor chip and the lead portion with a bonding wire; and
   molding the semiconductor chip with a sealing resin by contacting a resin sealing mold to the smooth surfaces of the part of the part of the upper surfaces of the lead portion and the smooth surface of the die pad portion and the lead portion.

7. A manufacturing method for a semiconductor device, comprising:
   forming a frame substrate with a die pad portion and a lead portion, by patterning a rolled copper plate or a rolled copper alloy plate;
   laminating metallic skins on an upper surface of the die pad portion, and on a portion of the lead portion to be connected to a bonding wire;
   surface-roughing the die pad portion and the lead portion, using a micro-etching solution having hydrogen peroxide and sulfuric acid as principal components, with a masking material covering bottom surfaces of the die pad portion and the lead portion having the metallic skins laminated thereon and a part of the upper surfaces of the lead portion to be brought into contact with a resin sealing mold so as to maintain smooth surfaces;
   removing the masking material;
   mounting a semiconductor chip on the upper surface of the die pad portion;
   connecting the semiconductor chip and the lead portion with a bonding wire; and
   molding the semiconductor chip with a sealing resin by contacting a resin sealing mold to the smooth surfaces of the part of the upper surfaces of the lead portion and the smooth surfaces of the bottom surfaces of the die pad portion and the lead portion.

* * * * *